United States Patent
Baguette et al.

(10) Patent No.: US 7,404,118 B1
(45) Date of Patent: Jul. 22, 2008

(54) MEMORY ERROR ANALYSIS FOR DETERMINING POTENTIALLY FAULTY MEMORY COMPONENTS

(75) Inventors: Benoit Leon Roger Ghislain Baguette, Les Waleffes (BE); Frederic Louis Ghislain Gabriel Vecoven, Angleur (BE)

(73) Assignee: Sun Microsystems, Inc., Santa Clara, CA (US)

( * ) Notice: Subject to any disclaimer, the term of this patent is extended or adjusted under 35 U.S.C. 154(b) by 271 days.

(21) Appl. No.: 10/932,768

(22) Filed: Sep. 2, 2004

(51) Int. Cl.
*G11C 29/00* (2006.01)
(52) U.S. Cl. .................... 714/723; 714/764
(58) Field of Classification Search .............. 714/718, 714/719, 723, 753, 764
See application file for complete search history.

(56) References Cited

U.S. PATENT DOCUMENTS

| | | | | |
|---|---|---|---|---|
| 4,964,130 A | * | 10/1990 | Bowden et al. | 714/764 |
| 5,684,977 A | * | 11/1997 | Van Loo et al. | 711/143 |
| 5,856,987 A | * | 1/1999 | Holman | 714/752 |
| 6,044,483 A | * | 3/2000 | Chen et al. | 714/762 |
| 6,779,148 B2 | * | 8/2004 | Tanaka | 714/753 |
| 6,973,613 B2 | | 12/2005 | Cypher | |
| 6,976,197 B2 | | 12/2005 | Faust | |
| 6,981,173 B2 | | 12/2005 | Ferguson | |

* cited by examiner

*Primary Examiner*—James C Kerveros
(74) *Attorney, Agent, or Firm*—Meyertons Hood Kivlin Kowert & Goetzel, P.C.; Erik A. Heter

(57) ABSTRACT

Accordingly, there has been described a computer system with a plurality of memory components where individual bits from multiple words are distributed among the memory components. An error analyzer is operable to identify a memory component as potentially faulty by accessing a table mapping syndromes to memory components using generated syndromes.

28 Claims, 5 Drawing Sheets

MEMORY ERROR ANALYSIS FOR DETERMINING POTENTIALLY FAULTY MEMORY COMPONENTS

BACKGROUND OF THE INVENTION

The present invention relates generally to computer systems and more specifically to the analysis of memory errors.

Particularly in high reliability computer systems, a significant proportion of the system downtime that can occur is as a result of memory errors and the interruptions in operation for memory hardware replacement. A frustration for manufacturers and operators is that up to 80% of the memory modules (e.g., dual in line memory (DIMM) modules) that are returned to memory vendors are diagnosed as "no trouble found" (NTF), indicating that good components have been replaced.

A reason for this is that in the absence of an accurate assessment of which of a number of potentially faulty DIMMs is indeed faulty, an engineer will replace all potentially faulty modules.

Accordingly, there is a need to improve the diagnosis of memory faults to further improve service reliability and to reduce the number of good units that are replaced.

SUMMARY OF THE INVENTION

An aspect of the invention provides a computer system comprising a plurality of memory components where bits are distributed among a plurality of the memory components and an error analyzer operable to identify a memory component as potentially faulty by using generated syndromes to access a table operable to map syndromes to memory components.

An embodiment of the invention is thus able to use the table to determine potentially faulty memory components. The table can be generated, for example, from a list of possible uncorrectable error syndromes for each memory component for all combinations of bits located in the memory component.

To further improve the identification of which memory component is faulty, the error analyzer can be configured to use the results of table accesses for each of a plurality of generated syndromes to identify a memory component as faulty when it is identified as potentially faulty for multiple generated syndromes.

Another aspect of the invention provides a computer system comprising plurality of memory components. Individual bits from a group of bits that comprises one or more words are stored distributed between the memory components, wherein the group of bits includes data bits and error correction code bits. A syndrome generator is operable to generate a syndrome from regenerated error correction code bits for a group of bits and stored error correction code bits for the stored group of bits. A table comprises entries linking syndromes to memory components. An error analyzer operable to identify a memory component as potentially faulty by accessing the table using a generated syndrome.

A further aspect of the invention provides a method of identifying a faulty memory component in a computer system. The method comprises generating a syndrome from regenerated error correction code bits for a group of bits and stored error correction code bits for said stored group of bits, wherein individual bits from the group of bits, which comprises comprising data bits and error correction code bits in one or more words, is distributed between memory components. The method also comprises identifying a memory component as potentially faulty by accessing a table comprising entries linking syndromes to memory components using a generated syndrome.

BRIEF DESCRIPTION OF THE DRAWINGS

Embodiments of the present invention will be described hereinafter, by way of example only, with reference to the accompanying drawings in which like reference signs relate to like elements and in which.

Figure 1:
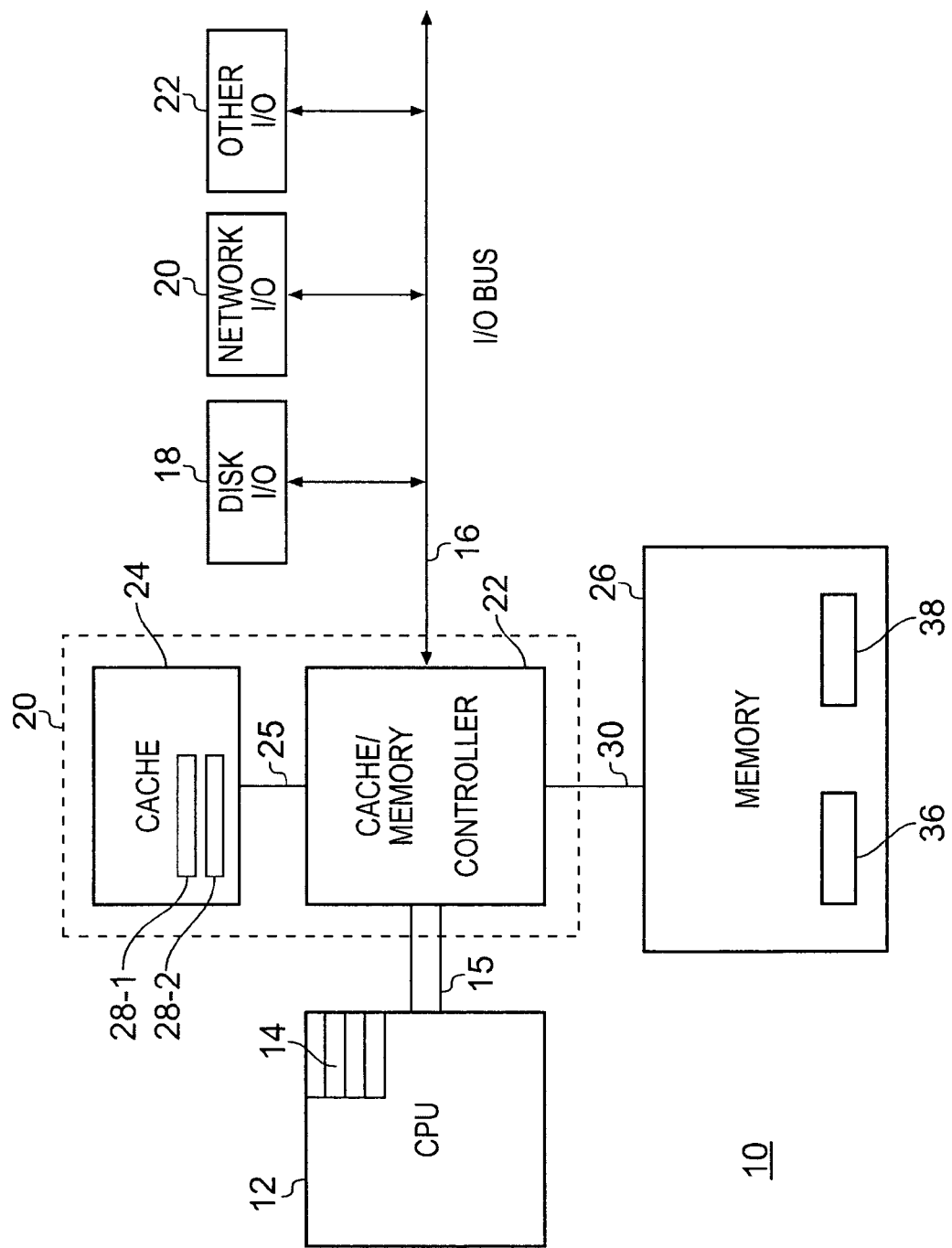
FIG. 1 is a schematic block diagram illustrating components of an example of a computer system in accordance with an embodiment of the invention.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims. In this regard, combinations of features from the independent claims with features of dependent claims other than as presented by the dependencies of the claims, and also with features from the description, are envisaged.

DESCRIPTION OF PARTICULAR EMBODIMENTS

FIG. 1 is a schematic block diagram of elements of a computer system, for example computer server system, of an embodiment of the present invention.

FIG. 1 illustrates a computer system 10 that includes a processing unit (here a central processing unit or CPU) 12. The processing unit can include a plurality of registers 14 and, for example, a first level cache. The processing unit is connected via a processor bus to a cache/memory subsystem 20. The cache/memory subsystem 20 in the present example combines the functions of a cache controller and a memory controller. However, in other embodiments of the invention, the cache controller could be separate from the memory controller. The cache controller functionality of the cache/memory controller is operable to control access to a second level cache 24 via a cache bus 25. The cache/memory controller 22 is also connected via one or more memory buses 30 to memory 26. The cache/memory controller 22 is also connected via an I/O bus 16 to a various I/O subsystems, such as, for example, disc I/O 18, network I/O 20 and other I/O 22 subsystems.

It will be appreciated that FIG. 1 provides a simplified overview of elements of one example of a computer system useful for an understanding of the present invention. Although FIG. 1 illustrates a system including a single processing unit, the invention is not limited thereto, and plural processing units may be provided. Similarly, although a single cache/memory controller 22 is illustrated, in embodiments of the invention, a plurality of cache/memory controllers 22 may be provided, each cache/memory controller 22 being connected to respective blocks of memory 26. Also, as indicated above, the cache controller functionality may be provided by units separate from that of the memory controller functionality.

Further, although the memory 26 is indicated by a single block, it will be appreciated that the memory may be provided by one or more memory modules, for example dual in-line memory modules (DIMMs).

Figure 2:
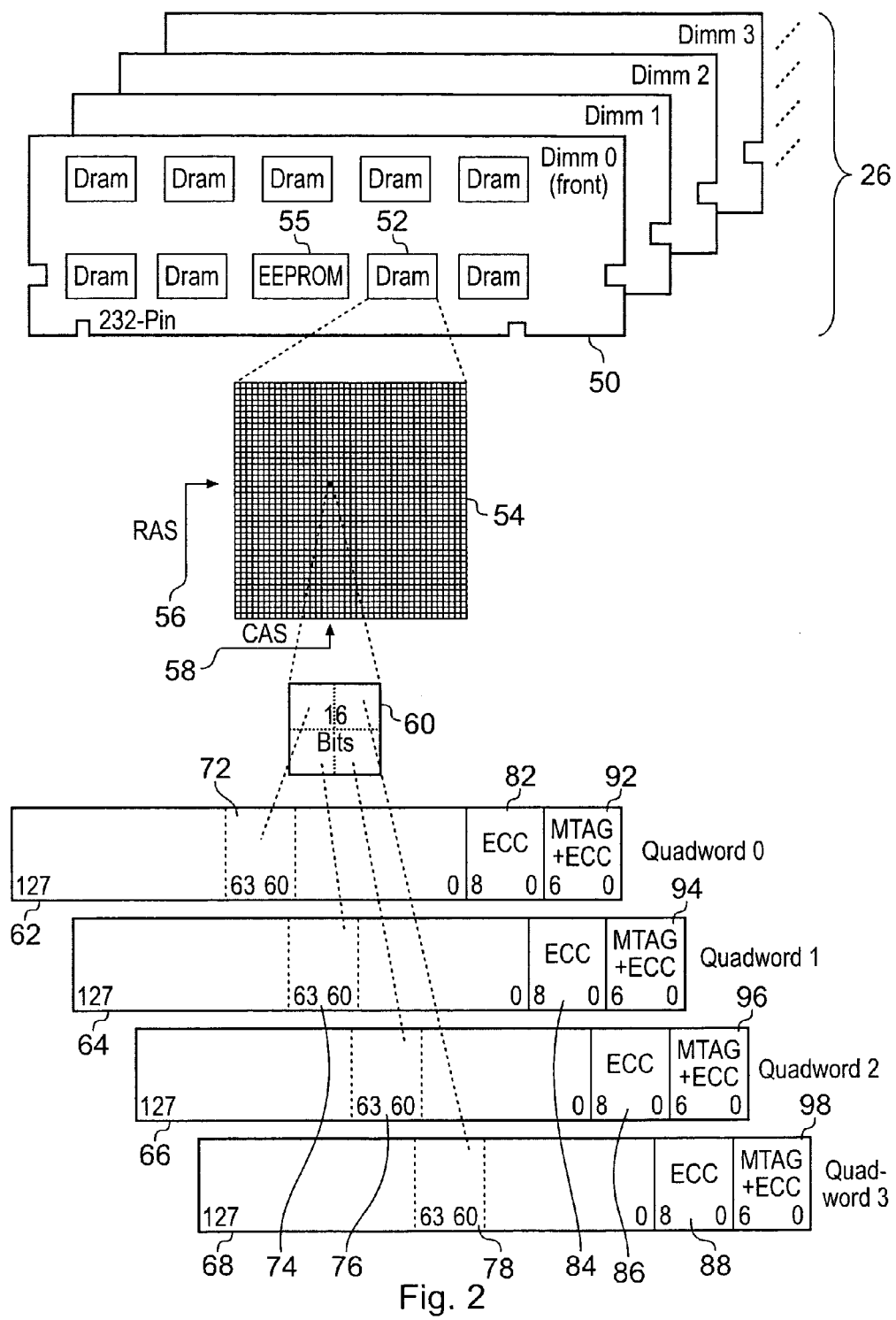
FIG. 2 provides an overview of a memory configuration for the computer system of FIG. 1.

FIG. 2 illustrates an example memory configuration for an embodiment of the invention.

As indicated above, the memory 26 may be indicated by a plurality of DIMMs 50, of which four are shown in FIG. 2. Each DIMM in the present example comprises two logical banks of nine memory components (in the present example, dynamic random access memory (DRAM) chips 52). In the present example, one logical bank of nine DRAM chips 52 is provided on the "front" surface of a DIMM 50 and the other logical bank is located on the "back" surface of the DIMM 50. Also illustrated in FIG. 2 is an electrically erasable programmable read only memory (EEPROM) 55.

In the present example, the physical address used by the CPU 12 to access memory is made of 64 bits. The 64 bits can be decoded into a board number, a memory controller (or CPU) on that board, a logical bank, a row address (RAS) for the DRAMs, a column address (CAS) for the DRAMs, and a quadword (0, 1, 2 or 3).

A DRAM chip 52 can be viewed as an array 54 of xMega of cells (x depends on the DRAM chip size). Each cell 60 in the array can be addressed by a row address (RAS) and a column address (CAS).

For a x16 DRAM chip, each cell will comprise 16 bits. Thus, 16 bits x9 DRAM chips x4 DIMMs=576 bits. These 576 bits can be split into four quadwords of 144 bits each. The 16 bits of a cell 60 can be distributed among the four quadwords (4 bits each) as represented in FIG. 2. Thus, as represented in FIG. 2, each of the quadwords 62, 64, 66, 68 includes 4 bits 72, 74, 76, 78 respectively, of the cell 60. The remaining bits of each of the quadwords represents other cells 60 within another array 54. The other array can be located on another DRAM, so that there are only 4 bits per DRAM chip in the present example. As also illustrated in FIG. 2, as well as 128 data bit, each quadword includes 9 ECC bits 82, 84, 86, 88, respectively and 7 memory tag bits (MTAG) 92, 94, 96 98, respectively. Distributing the bits of the quadwords in the various DRAMS facilitates the identification of a faulty DIMM and facilitates the improved fault analysis to be described in the following.

In the example of the present invention described with reference to FIGS. 1 and 2, a cache line comprises four "quadwords", each with 144 bits as illustrated in FIG. 2. The error correction code (ECC) used is a single error correction dual error detection with 4 bit error correction in a single nibble (4 bits). Such a "SEC-DED-S4ED" code can cover the 128 bits plus the ECC itself. If the 144 bits were divided into 4 bit nibbles, the code can then detect 3- and 4-bit errors in a single nibble.

In various examples of the invention, x4, x8 and x16 DRAMs can be used. It is desirable to be able to detect entire part failures with the error correction code. The error correction codes themselves are not capable of detecting 16-bit errors. Thus, the distribution of the 16 bits of a single DRAM among the four quadwords is provided such that a single part failure is detected as multiple uncorrectable errors.

For x4 parts, a single failure is, in fact, correctable. This can be identified by routing 4 bits from the DRAM to 4 separate quadwords, so that the single part failure results in multiple (up to four) correctable errors. However, in the case of x16 parts, a part failure would not be directly correctable, but this would be detectable in an example of the present invention. For example, a cache line will access 576/16=36 of these parts.

As indicated above, each DIMM 50 has two banks of 9 DRAMs in the present example, one on the "front" and one on the "back" of the DIMM 50. As also indicated with reference to FIG. 2, a DRAM chip forming a memory component can contain up to 4 bits of a quadword. This is provided in that 4 bits x9 DRAMs (front or back)×4 DIMMs=144 bits=one quadword.

A DIMM failure can occur in various ways.

A soft error is an error which relates to a naturally occurring event, for example caused by an energetic cosmic ray or its by-product (e.g., high energy or thermal neutrons). These events do not cause permanent damage to the DRAM, but the data stored is lost and must be restored. No corrective action needs to be taken for soft error events.

Hard errors can occur when damage occurs to a DRAM due, for example, to effects like dielectric breakdown or metal lines opening or shorting. This can result in the permanent failure of the device, and corrective action must be taken to replace the faulty component.

Weak errors occur when a hard failure looks like a soft error. A weak bit can be a cell that tends to lose data over time or is easily upset from a given state. In DRAMs, this can occur as a result of leakage of a capacitor node that stores charge. Memory vendors use various text programs to screen for such weak cells, but due to effects like device degradation, there is always the possibility that defect free memory could develop weak bit symptoms over time.

As indicated above, soft errors result in correctable errors. This is because a cosmic ray will only upset a single memory cell or possibly a couple of adjacent memory cells. In the latter case, the cells do not correspond to the same quadword, with a configuration as described above, and therefore cannot generate an incorrectable error, i.e. an error with more multiple bits per quadword, but rather multiple correctable errors.

On the other hand, hard errors and weak errors can generate uncorrectable errors. Typically, the probability of having multiple DRAM chips failing at the same time on the same DIMM is very low indeed.

Accordingly, when a DRAM chip is failing, it will generate correctable errors and also uncorrectable errors. Since a DRAM chip can own 4 bits per quadword, it could generate an uncorrectable error with a maximum 4 bits in error. In order to detect and correct errors, error detection/correction logic is provided which regenerates an error correction code from a quadword retrieved from memory, and performs an exclusive OR with the error correction code actually retrieved from that quadword from memory. The result of the exclusive OR operation is termed a "syndrome". Non-zero bits in the syndrome indicate one or more errors have occurred.

In the case of a correctable error, the syndrome will identify which bit was in error. Knowing which bit is in error, enables an identification of the DIMM from which the bit came. However, for an uncorrectable error, it is necessary to use the following syndrome property:

assume that "syndrome [bit x]" is the syndrome when bit x only is in error assume that "syndrome [bit y]" is the syndrome when bit y only is in error assume that "syndrome [bits x & y]" is the syndrome when both bit x and bit y are in error then "syndrome [bits x & y]" equals syndrome [bit x] XOR syndrome [bit y]".

Knowing this property, knowing which bit is assigned to which DRAM (according to the board construction) and assuming that the uncorrectable error is coming from a single DRAM chip failure (as opposed to multiple DRAM chips failing or multiple DIMMs failing at the same time, which is very unlikely) a list of possible DRAM chips which could have caused the uncorrectable error to happen can be generated.

For example, consider two examples for double bit errors:
syndrome 0x1b: DRAM chip 35 (bits 124 & 126)
syndrome 0x1e: DRAM chip 22 (bits 75 & 76)
or DRAM chip 23 (bits 78 & 79)
or DRAM chip 29 (bits 100 & 101)
or DRAM chip 35 (bits 124 & 125)

Accordingly, it is possible to calculate a list of all possible uncorrected syndromes for each DRAM chip using all combinations of the 4 bits located in the DRAM chip. The results can then be sorted to create a table "syndrome versus DRAM chips" where each row represents the syndrome and each column represents a DRAM chip.

Figure 3:
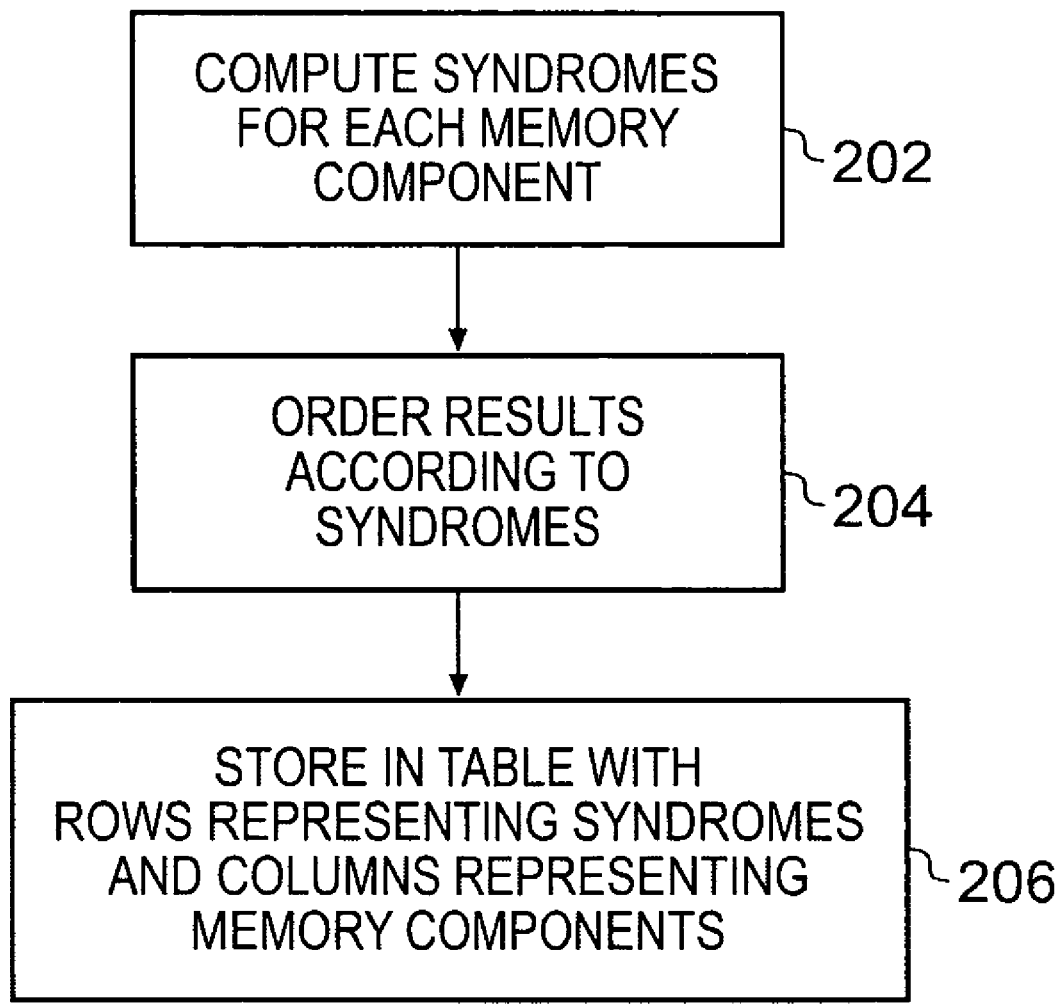
FIG. 3 is a schematic representation of functional elements of a memory controller.

This process is illustrated in FIG. 3.

In step 202, syndromes for each memory component (each DRAM chip) 52 are computed.

In step 204, the results are ordered according to the syndromes. In step 206, the table is created with rows representing syndromes and columns representing memory components.

The table could be configured as a sparse relationship table with full rows and full columns and the correspondence between a syndrome code a memory component being indicated by populating the table grid at the appropriate row/column intersection. Alternatively, the table could be implemented using run-length codes or any other approach in order to indicate the relationship between the syndromes and the memory components for which that syndrome may be indicative of a potential component failure.

With the use of this table, it is possible to provide further analysis of an uncorrectable error. For example, if a memory controller (e.g., for up to two banks) has seen multiple syndromes, each syndrome can be accessed in the aforementioned table and a list of possible matching DRAM chips can be identified. By computing the intersection of all lists, it is possible to determine a faulty DRAM chip.

Figure 4:
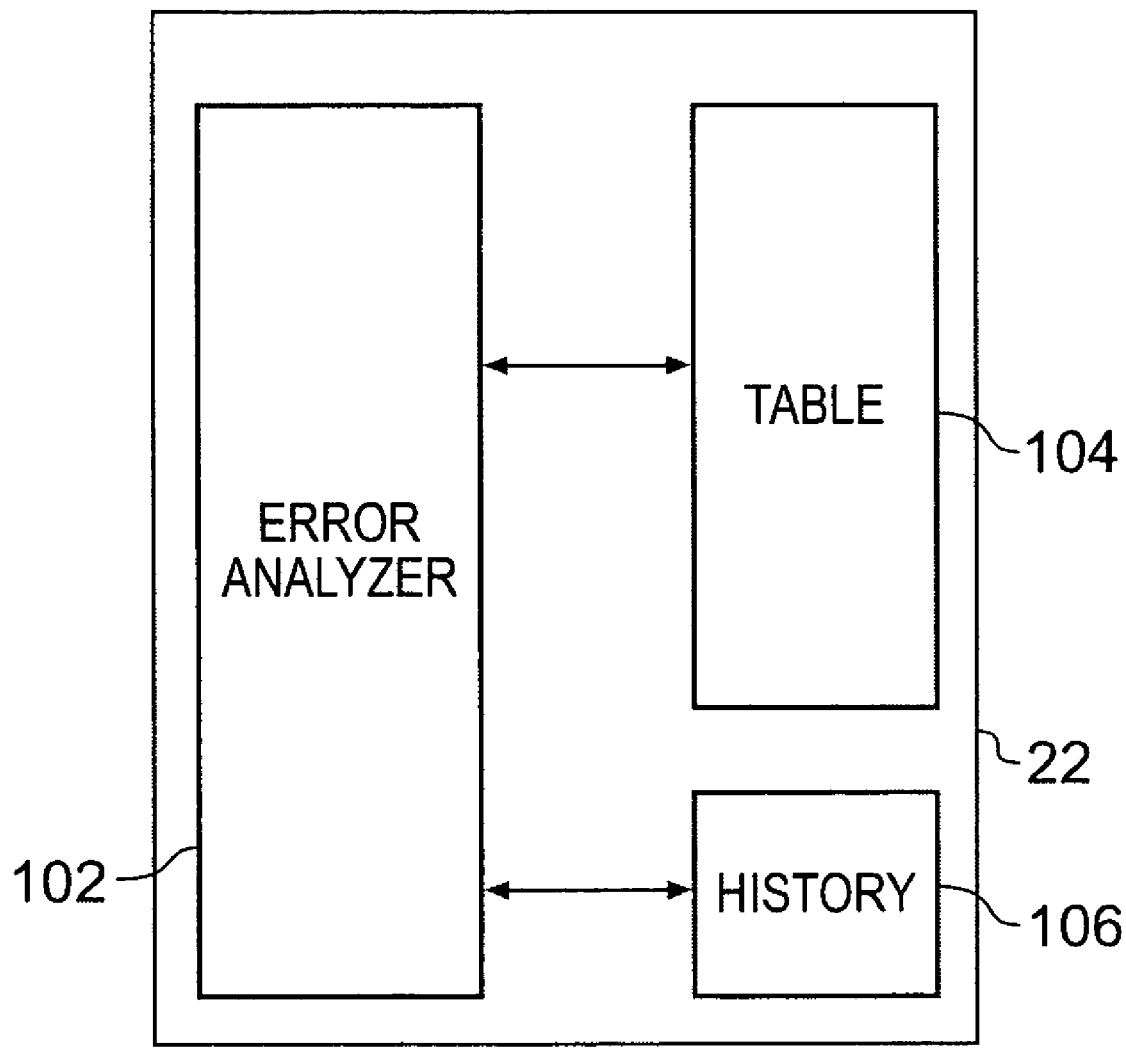
FIG. 4 is a flow diagram illustrating the generation of a syndrome to memory components table.

FIG. 4 illustrates components of an example of a memory controller according to the present invention. In the example illustrated in FIG. 4, the memory controller includes (as well as other components) and error analyzer 102, a syndrome versus DRAM chips table 104, and history storage 106, the purpose of which will be explained in the following.

Figure 5:
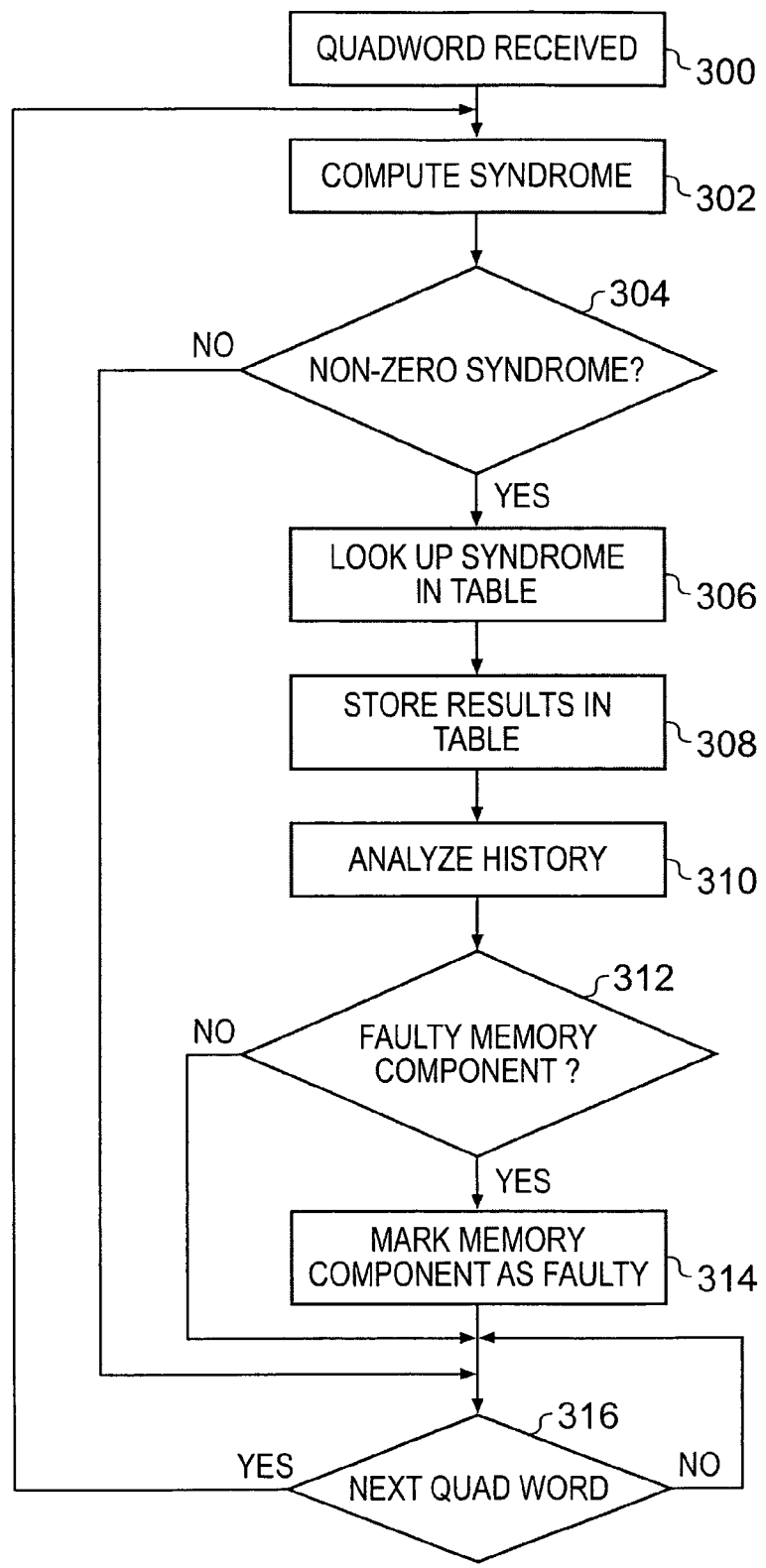
FIG. 5 is a flow diagram illustrating aspects of the operation of an embodiment of the invention.

FIG. 5 illustrates an example of a process performed by the error analyzer 102 for analyzing errors in accordance with one example of the present invention.

On receiving a quadword of data, a syndrome is generated as step 300.

On receipt of a quadword in step 300, a syndrome is computed in step 302.

If it is detected in step 304 that a non-zero syndrome resulted, then in step 306, the syndrome is used to access the table 104. Otherwise control passes to step 316.

After accessing the table 104 in step 306, in step 308 the results of the syndrome look up are stored in the history storage 106.

In step 310, the history is analyzed.

If, in step 312, the comparison of the table look up results for the generated syndromes consistently identifies a given memory component, then this indicates that it is the given memory component that is faulty. If a faulty memory component has been identified in step 312, then in step 314, the memory component is marked as faulty, for example by setting a fault bit in the EEPROM 55.

Alternatively, if a memory component is not identified as being faulty in step 312, then step 314 is bypassed.

Then, the system waits for the next quadword to be received at step 316 and on receipt of the next quadword, control passes back to step 302.

The use of the syndrome history facilitates the operation of the present invention because, in most cases, a DRAM chip will generate several faults when it is failing. For example, initially, correctable errors may be seen, followed by uncorrectable errors.

An example of the present invention can also be effective to identify a faulty DIMM (by identifying a faulty DRAM on the DIIM) in the event of multiple uncorrectable errors. In other words, it is not necessary for there to be correctable errors followed by uncorrectable errors. The analysis can be performed in the event of there being simply multiple errors.

Two examples of operation are given below.

Example 1

Correctable Errors Were Seen assume that the memory controller has seen syndromes 0x70, 0x1b5, 0x1c5
analysis:
0x70: correctable, dramchip 33
0x1b5: uncorrectable, dramchip 28 or 33
0x1c5: correctable, dramchip 33
=>dramchip is faulty, identifying a single dimm Example 2

No Correctable Errors Were Seen assume that the memory controller has seen syndromes 0x5c 0x15b 0x155
analysis:
0x5c: uncorrectable, dramchip 3, 9 or 15
0x15b: uncorrectable, dramchip 4 or 9
0x155: uncorrectable, dramchip 9 or 28
=>dramchip 9 is faulty, identifying a single dimm Accordingly, there has been described a computer system with a plurality of memory components where bits (e.g., of a multi-word such as a quadword) are distributed among the memory components. An error analyzer is operable to identify a memory component as potentially faulty by accessing a table mapping syndromes to memory components using generated syndromes.

Although the embodiments above have been described in considerable detail, numerous variations and modifications will become apparent to those skilled in the art once the above disclosure is fully appreciated. It is intended that the following claims be interpreted to embrace all such variations and modifications.

For example, although in the present example the bits of a cell are distributed among the memory chips such there are only 4 bits per DRAM chip, in other examples of the invention a different maximum number of bits of a cell per DRAM chip could be employed, according to the maximum number of error bits detectable by the error correcting code. In other words, each memory component can comprise a predetermined maximum number of bits of a group of bits according to a corresponding number of error bits detectable by the error correcting code used.

Although the present invention can be implemented by hardware, it could also be implemented using software. Accordingly, a computer program product for implementing the invention can be in the form of a computer program, which could for example, be carried by a carrier medium. The carrier medium could be a storage medium, such as a solid state, magnetic, optical, magneto-optical or other storage medium. The carrier medium could be a transmission medium such as broadcast, telephonic, computer network, wired, wireless, electrical, electromagnetic, optical or indeed any other transmission medium.

What is claimed is:

1. A computer system comprising a plurality of memory components where bits are distributed among a plurality of the memory components and an error analyzer operable to, for an uncorrectable multiple bit error, identify a memory component as potentially faulty by using generated syndromes to access a table operable to map syndromes to memory components, wherein the syndromes are generated using bits of an error correction code, wherein the error correction code is a SEC-DED-S4ED code.

2. The computer system of claim 1, wherein the error analyzer is operable to use the results of table accesses for each of a plurality of generated syndromes to identify a memory component as faulty when it is identified as potentially faulty for multiple generated syndromes.

3. A computer system comprising:
    a plurality of memory components, wherein bits from a group of bits that comprises one or more words are stored distributed between memory components, the group of bits comprising data bits and error correction code bits, wherein the error correction code is a SEC-DED-S4ED code;
    a syndrome generator, operable to generate a syndrome from regenerated error correction code bits for the group of bits and stored error correction code bits for the stored group of bits;
    a table comprising entries linking syndromes to memory components; and
    an error analyzer operable to, for an uncorrectable multiple bit error, identify a memory component as potentially faulty by accessing the table using a generated syndrome.

4. The computer system of claim 3 wherein the table is generated from a list of syndromes for each memory component for all combinations of bits for the group of bits located in the memory component.

5. The computer system of claim 3, wherein the error analyzer is operable to record the results of the table access.

6. The computer system of claim 3, wherein the error analyzer is operable to compare the results of table accesses for each of a plurality of generated syndromes to identify a memory component as faulty when it is identified as potentially faulty for multiple generated syndromes.

7. The computer system of claim 3, wherein the table is a two dimensional table with one of said axes being representative of syndrome codes and the other axis being representative of memory components.

8. The computer system of claim 7, wherein rows in the table are representative of syndrome codes and columns in the table are representative of memory components.

9. The computer system of claim 3, wherein each memory component comprises a predetermined maximum number of bits of a group of bits according to a corresponding number of error bits detectable by an error correcting code of the error correction code bits.

10. The computer system of claim 3, wherein each memory component comprises a maximum of four bits of a group of bits.

11. The computer system of claim 3, wherein each group of bits comprises a quadword.

12. The computer system of claim 11, wherein each quadword comprises 144 bits and each memory component comprises four bits from a quadword, and wherein each quadword includes 128 data bits, 9 error correction code bits, and 7 memory tag bits.

13. The computer system of claim 3, wherein each memory component is a memory chip.

14. The computer system of claim 13 comprising at least one memory module, wherein the memory module comprises a plurality of memory chips.

15. The computer system of claim 14, wherein the memory module is a dual in line memory module.

16. A method of identifying a faulty memory component in a computer system, the method comprising:
    generating a syndrome from regenerated error correction code bits for a group of bits and stored error correction code bits for a stored group of bits, wherein bits from the group of bits, which comprises data bits and error correction code bits in one or more words, are distributed between memory components, wherein the error correction code is a SEC-DED-S4ED code; and
    for an uncorrectable multiple bit error, identifying a memory component as potentially faulty by accessing a table comprising entries linking syndromes to memory components using a generated syndrome.

17. The method of claim 16, wherein the table is generated from a list of possible syndromes for each memory component for all combinations of bits located in the memory component.

18. The method of claim 17, comprising recording the results of the table access.

19. The method of claim 16, comprising comparing the results of table accesses for each of a plurality of generated syndromes to identify a memory component as faulty when it is identified as potentially faulty for multiple generated syndromes.

20. The method of claim 16, wherein the table is a two dimensional table with one of said axes being representative of syndrome codes and the other axis being representative of memory components.

21. The method claim 20, wherein rows in the table are representative of syndrome codes and columns in the table are representative of memory components.

22. The method of claim 16, wherein each memory component comprises a predetermined maximum number of bits of a group of bits according to a corresponding number of error bits detectable by the error correcting code of the error correction code bits.

23. The method of claim 16, wherein each memory component comprises a maximum of four bits of a group of bits.

24. The method of claim 16, wherein each group of bits comprises a quadword.

25. The method of claim 24, wherein each quadword comprises 144 bits and each memory component comprises four bits from a quadword, wherein each quadword comprises 128 data bits, 9 error correction code bits, and 7 memory tag bits.

26. The method of claim 16, wherein each memory component is a memory chip.

27. A computer system comprising:
    memory means for storing bits from a group of bits that comprises one or more words, wherein individual bits from the group of bits are stored distributed between memory components, said group of bits comprising data bits and error correction code bits, wherein the error correction code is a SEC-DED-S4ED code;

a syndrome means for generating a syndrome from regenerated error correction code bits for a said group of bits and stored error correction code bits for said stored group of bits; and table means for entries linking syndromes to memory components; and error analysis means for identifying a memory component, for an uncorrectable multiple bit error, as potentially faulty by accessing the table using a generated syndrome.

28. A computer program product comprising program code operable to perform the steps of:

generating a syndrome from regenerated error correction code bits for a group of bits and stored error correction code bits for a stored group of bits, wherein individual bits from the group of bits, which comprises comprising data bits and error correction code bits in one or more words, is distributed between memory components, wherein the error correction code is a SEC-DED-S4ED code; and for an uncorrectable multiple bit error, identifying a memory component as potentially faulty by accessing a table comprising entries linking syndromes to memory components using a generated syndrome.

* * * * *